(12) United States Patent
Takimoto et al.

(10) Patent No.: US 11,339,050 B2
(45) Date of Patent: May 24, 2022

(54) ACTUATOR DEVICE

(71) Applicant: HAMAMATSU PHOTONICS K.K., Hamamatsu (JP)

(72) Inventors: Sadaharu Takimoto, Hamamatsu (JP); Yuki Morinaga, Hamamatsu (JP); Daiki Suzuki, Hamamatsu (JP); Yoshihisa Warashina, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/789,795

(22) Filed: Feb. 13, 2020

(65) Prior Publication Data
US 2020/0180944 A1    Jun. 11, 2020

Related U.S. Application Data

(63) Continuation of application No. 16/070,562, filed as application No. PCT/JP2016/088436 on Dec. 22, 2016, now Pat. No. 10,589,985.

(30) Foreign Application Priority Data

Jan. 21, 2016 (JP) .................. 2016-009889

(51) Int. Cl.
*H01L 41/113* (2006.01)
*H01L 41/047* (2006.01)
(Continued)

(52) U.S. Cl.
CPC .......... *B81B 7/0006* (2013.01); *B81B 3/0075* (2013.01); *G02B 26/08* (2013.01);
(Continued)

(58) Field of Classification Search
CPC ......... B81C 99/00–0095; B81C 2201/00–117; B81C 2203/00–0792;
(Continued)

(56) References Cited

U.S. PATENT DOCUMENTS 8,218,218 B2    7/2012 Tauscher et al.
2004/0183149 A1*  9/2004 Schenk ............... G02B 26/101
                                                257/415
(Continued)

FOREIGN PATENT DOCUMENTS

CN    1800906 A    7/2006
CN    104062754 A    9/2014
(Continued)

OTHER PUBLICATIONS

International Preliminary Report on Patentability dated Aug. 2, 2018 for PCT/JP2016/088436.

*Primary Examiner* — Cuong B Nguyen
(74) *Attorney, Agent, or Firm* — Faegre Drinker Biddle & Reath LLP

(57) ABSTRACT

An actuator device includes a support portion, a movable portion, a connection portion which connects the movable portion to the support portion on a second axis, a first wiring which is provided on the connection portion, a second wiring which is provided on the support portion, and an insulation layer which includes a first opening exposing a surface opposite to the support portion in a first connection part located on the support portion in one of the first wiring and the second wiring and covers a corner of the first connection part. The rigidity of a first metal material forming the first wiring is higher than the rigidity of a second metal material forming the second wiring. The other wiring of the first wiring and the second wiring is connected to the surface of the first connection part in the first opening.

17 Claims, 8 Drawing Sheets

(51) Int. Cl.
*B81B 7/00* (2006.01)
*G02B 26/08* (2006.01)
*B81B 3/00* (2006.01)

(52) U.S. Cl.
CPC ...... *G02B 26/085* (2013.01); *B81B 2201/042* (2013.01); *B81B 2201/045* (2013.01); *B81B 2203/0154* (2013.01); *B81B 2203/0181* (2013.01); *B81B 2203/058* (2013.01); *B81B 2207/07* (2013.01)

(58) Field of Classification Search
CPC ........... B81C 1/00523–00571; B81C 1/00587; B81C 1/00595; B81C 1/00841–00857; B81B 1/00–008; B81B 3/00–0097; B81B 5/00; B81B 7/00–04; B81B 2201/00–13; B81B 2203/00–06; B81B 2207/00–09; B81B 7/0006; B81B 3/0075; B81B 2203/0181; B81B 2201/042; B81B 2201/045; B81B 2203/0154; B81B 2203/058; B81B 2207/07; G02B 26/08; G02B 26/085

See application file for complete search history.

(56) References Cited

U.S. PATENT DOCUMENTS

| | | | |
|---|---|---|---|
| 2006/0141659 A1* | 6/2006 | Gan | G02B 26/0866 438/51 |
| 2007/0089973 A1 | 4/2007 | Inui et al. | |
| 2010/0259806 A1 | 10/2010 | Tauscher et al. | |
| 2012/0099176 A1 | 4/2012 | Zhou | |
| 2015/0183632 A1* | 7/2015 | Su | B81B 7/008 257/415 |
| 2016/0105090 A1* | 4/2016 | Sadaharu | G02B 26/0841 310/38 |

FOREIGN PATENT DOCUMENTS

| | | | | |
|---|---|---|---|---|
| EP | 1 408 336 A2 | 4/2004 | | |
| JP | H8-186975 A | 7/1996 | | |
| JP | 2001-264677 A | 9/2001 | | |
| JP | 2001-519726 A | 10/2001 | | |
| JP | 2006-085152 A | 3/2006 | | |
| JP | 2007-111847 A | 5/2007 | | |
| JP | 2009-251002 A | 10/2009 | | |
| JP | 2010-098905 A | 4/2010 | | |
| JP | 2012-123364 A | 6/2012 | | |
| JP | 2013-35081 A | 2/2013 | | |
| JP | WO 2014/109170 A1 * | 7/2014 | ............. | G02B 26/10 |
| JP | 2014-182225 A | 9/2014 | | |
| JP | 2014-228861 A | 12/2014 | | |
| JP | 2015-31786 A | 2/2015 | | |
| JP | 2015-31792 A | 2/2015 | | |
| WO | WO-98/44571 A1 | 10/1998 | | |
| WO | WO 2014/109170 A1 | 7/2014 | | |
| WO | WO-2015/171227 A1 | 11/2015 | | |

* cited by examiner

ACTUATOR DEVICE

TECHNICAL FIELD

The present disclosure relates to an actuator device configured as, for example, a micro electro mechanical systems (MEMS) device.

BACKGROUND ART

As an MEMS device, there is known an actuator device including a support portion, a movable portion, a connection portion connecting the movable portion to the support portion on a predetermined axis so that the movable portion is swingable about the axis, and wirings provided on the connection portion and the support portion. In such an actuator device, for example, there are cases in which the movable portion is oscillated at a high speed corresponding to a resonance frequency level (several kHz to several tens of kHz). In such a case, because metal fatigue occurs in the wiring on the connection portion, there is concern that characteristics may be deteriorated and disconnection may occur.

In order to solve the above-described problems, there is proposed a technique in which a first wiring formed of a high-rigid metal material is provided on a connection portion and the first wiring is electrically connected to a second wiring formed of a low-rigid metal material in a low-stress region on a support portion (for example, see Patent Literature 1).

CITATION LIST

Patent Literature

Patent Literature 1: U.S. Pat. No. 8,218,218

SUMMARY OF INVENTION

Technical Problem

The present inventor has found that it is possible to further suppress deterioration of wirings provided on the connection portion and the support portion by contriving an electric connection structure between the first wiring and the second wiring in addition to disposing the electric connection position between the first wiring and the second wiring on the support portion.

An object of an embodiment of the present disclosure is to provide an actuator device capable of suppressing deterioration of wirings provided on a connection portion and a support portion.

Solution to Problem

An actuator device according to an embodiment of the present disclosure includes: a support portion; a movable portion; a connection portion which connects the movable portion to the support portion on a predetermined axis so that the movable portion is swingable about the axis; a first wiring which is provided on the connection portion; a second wiring which is provided on the support portion; and an insulation layer which includes a first opening exposing a surface opposite to the support portion in a first connection part located on the support portion in one wiring of the first wiring and the second wiring and covers a corner of the first connection part, in which rigidity of a first metal material forming the first wiring is higher than rigidity of a second metal material forming the second wiring, and in which the other wiring of the first wiring and the second wiring is connected to the surface of the first connection part in the first opening.

In the actuator device, the rigidity of the first metal material forming the first wiring provided on the connection portion is higher than the rigidity of the second metal material, forming the second wiring provided on the support portion. Accordingly, deterioration of the first wiring provided on the connection portion is suppressed. Also, deformation (curving or the like) of the support portion caused when all of the wirings provided on the connection portion and the support portion are formed of a high-rigid metal material is also suppressed. Further, the first wiring and the second wiring are connected to each other at the first connection part located on the support portion. Accordingly, because stress applied to the first connection part is reduced, deterioration of the first connection part is suppressed. Further, the corner of the first connection part is covered by the insulation layer and the first wiring and the second wiring are connected to each other in the surface opposite to the support portion in the first connection part exposed by the first opening of the insulation layer. Accordingly, because stress applied from the first wiring to the second wiring is reduced by the insulation layer, deterioration of the second wiring formed of the second metal material having rigidity lower than that of the first metal material is suppressed. Thus, according to the actuator device, it is possible to suppress deterioration of the wirings provided on the connection portion and the support portion.

In the actuator device according to an embodiment of the present disclosure, the first connection part may be separate from the axis by a predetermined distance. According to this configuration, it is possible to suppress stress applied to the first connection part while securing a region for providing another configuration on the support portion.

In the actuator device according to an embodiment of the present disclosure, the distance may be larger than ½ times a minimum width of the connection portion. According to this configuration, it is possible to further reduce stress applied to the first connection part while securing a region for providing another configuration on the support portion.

In the actuator device according to an embodiment of the present disclosure, a cross-sectional area of the first wiring may be larger than a cross-sectional area of the second wiring. According to this configuration, it possible to suppress an increase in resistance value of the first wiring even when the resistivity of the first metal material is higher than that of the second metal material.

In the actuator device according to an embodiment of the present disclosure, a width of the first wiring may be larger than a width of the second wiring. According to this configuration, it is possible to suppress an increase in resistance value of the first wiring by securing the cross-sectional area of the first wiring while suppressing the torsion of the connection portion from being obstructed.

In the actuator device according to an embodiment of the present disclosure, the first opening may be separate from the corner of the first connection part. According to this configuration, it is possible to reliably reduce stress applied from the first wiring to the second wiring.

In the actuator device according to an embodiment of the present disclosure, a region corresponding to the corner of the first connection part in a surface opposite to the support portion in the insulation layer may be curved in a convex shape toward the opposite side to the support portion.

According to this configuration, it is possible to further reduce stress applied from the first wiring to the second wiring.

The actuator device according to an embodiment of the present disclosure may further include a coil which is provided with the movable portion; a magnetic field generator which applies a magnetic field to the coil; and a third wiring which is provided on the movable portion and is electrically connected to the coil, in which the insulation layer may include a second opening exposing a surface opposite to the movable portion in a second connection part located on the movable portion in one wiring of the first wiring and the third wiring and cover a corner of the second connection part, in which rigidity of the first metal material may be higher than rigidity of a third metal material forming the third wiring, and in which the other wiring of the first wiring and the third wiring may be connected to the surface of the second connection part in the second opening. According to this configuration, it is possible to suppress deterioration of the wirings provided on the connection portion and the movable portion.

The actuator device according to an embodiment of the present disclosure may further include a frame which supports the support portion and the movable portion, in which the support portion is connected to the frame to be swingable about an axis intersecting the axis. According to this configuration, it is possible to swing the movable portion about each of two orthogonal axes.

The actuator device according to an embodiment of the present disclosure may further include a mirror which is provided with the movable portion. According to this configuration, it is possible to use the mirror for the light scanning or the like by swinging the mirror about the axis.

Advantageous Effects of Invention

According to an embodiment of the present disclosure, it is possible to suppress deterioration of the wirings provided on the connection portion and the support portion.

DESCRIPTION OF EMBODIMENT

Figure 1:
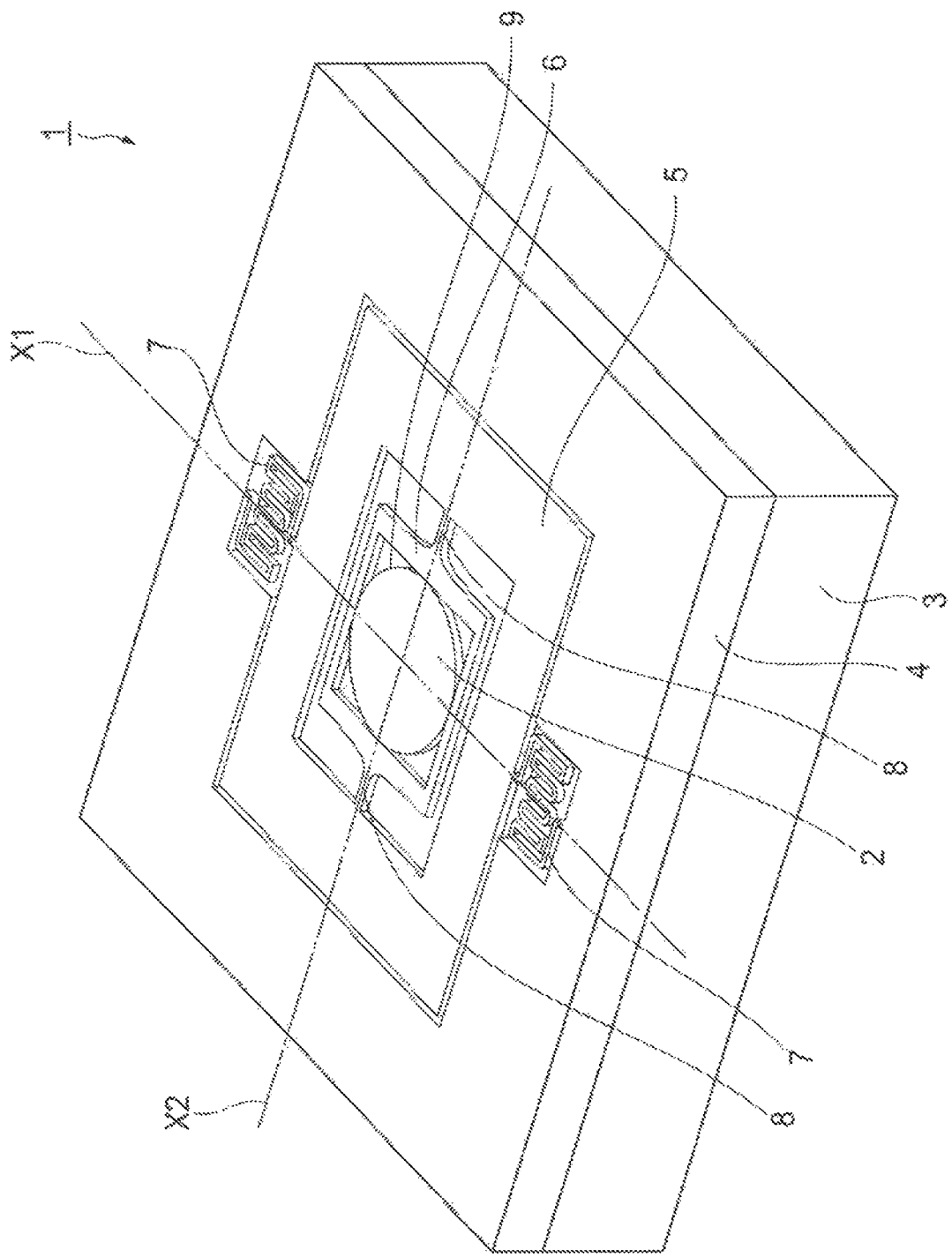
FIG. 1 is a perspective view of an actuator device according to an embodiment of the present disclosure.

Hereinafter, an embodiment of the present disclosure will be described in detail with reference to the drawings. In the following description, the same reference numerals will be used for the same or corresponding components and a repetitive description will be omitted.

Figure 2:
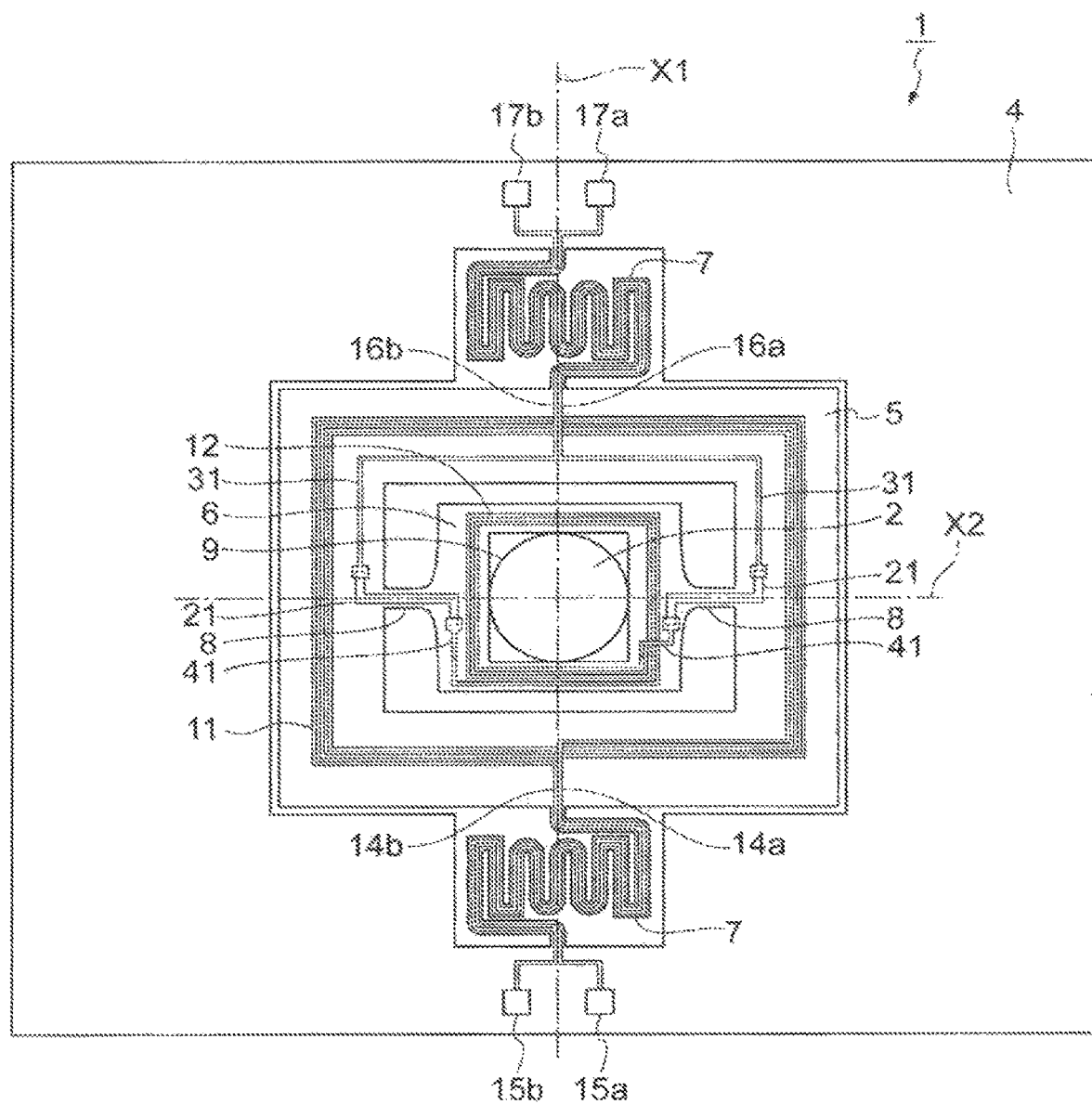
FIG. 2 is a plan view of a circuit configuration of the actuator device of FIG. 1.

As illustrated in FIGS. 1 and 2, an actuator device 1 includes a mirror 2, a magnetic field generator 3, a frame 4, a support portion 5, a movable portion 6, a pair of connection portions 7, and a pair of connection portions 8. The actuator device 1 is configured as an MEMS device which swings the mirror 2 about each of a first axis XL and a second axis X2 which are orthogonal to each other. Such an actuator device 1 is used in, for example, an optical switch or optical scanner.

The mirror 2 is a light reflection film formed by a metal film. The mirror 2 has a circular shape in the plan view (when viewed from a direction orthogonal to a plane in which at least the support portion 5, the movable portion 6, and the pair of connection portions 7 are arranged). A metal material forming the mirror 2 is, for example, aluminum (Al), gold (Au), or silver (Ag).

The magnetic field generator 3 is a rectangular flat plate and includes a pair of main surfaces. The magnetic field generator 3 applies a magnetic field to a coil 11 provided with the support portion 5 and a coil 12 provided with the movable portion 6 (the coils 11 and 12 will be described later). The magnetic field generator 3 is configured as, for example, a permanent magnet or the like. The array of the magnetic poles of the magnetic field generator 3 is, for example, a Halbach array.

The frame 4 is a flat plate-shaped frame having a rectangular shape in the plan view. The frame 4 is disposed on one main surface of the magnetic field generator 3. The frame 4 supports the support portion 5, the movable portion 6, and the mirror 2 via the pair of connection portions 7. Each connection portion 7 connects the support portion 5 to the frame 4 on the first axis X1 so that the support portion 5 is swingable about the first axis X1. That is, each connection portion 7 serves as a torsion bar. Each connection portion 7 is formed in an S-shape in the plan view in order to improve the strength and facilitate the adjustment of the torsion spring constant.

The support portion 5 is a flat plate-shaped frame having a rectangular shape in the plan view and is located at the inside of the frame 4. The support portion 5 is disposed to face one main surface of the magnetic field generator 3 and to be separate from one main surface of the magnetic field generator 3. The support portion 5 supports the movable portion 6 and the mirror 2 via the pair of connection portions 8. Each connection portion 8 connects the movable portion 6 to the support portion 5 on the second axis X2 so that the movable portion 6 is swingable about the second axis X2. That is, each connection portion 8 serves as a torsion bar.

Figure 3:
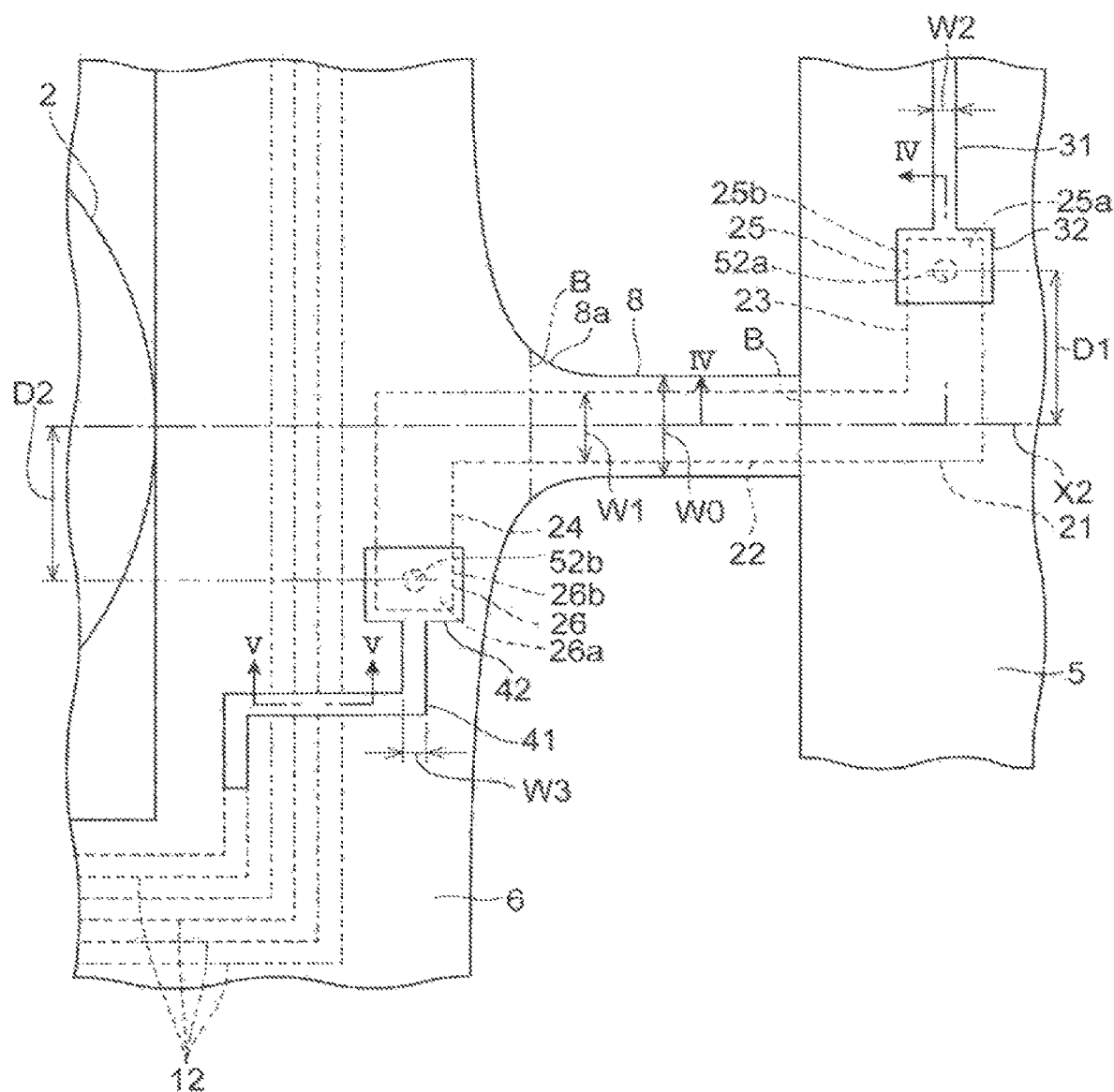
FIG. 3 is a partially enlarged view of FIG. 2.

As illustrated in FIG. 3, each connection portion 8 is a flat plate-shaped member having a substantially rectangular shape in the plan view and extends along the second axis X2. An end 8a on the side of the movable portion 6 in each connection portion 8 increases in width as it approaches the movable portion 6. Here, the width of the connection portion 8 means the length, of the connection portion 8 in a direction orthogonal to the second axis X2 in the plan view. When the connection portion 8 increases in width in at least one end and is connected to the support portion 5 or the movable portion 6, the connection portion 8 is, for example, a region until the width becomes 1.5 times a minimum width W0. In FIG. 3, a boundary B between the connection portion 8 and the support portion 5 and a boundary B between the connection portion 8 and the movable portion 6 are indicated by a two-dotted chain line. The connection portion 8 may be a region where the stress applied during the swing of the movable portion 6 with respect to the support portion 5 is larger than ⅔ times the maximum stress.

As illustrated in FIGS. 1 and 2, the movable portion 6 is a flat plate-shaped frame having a rectangular shape in the plan view and is located at the inside of the support portion 5. The movable portion 6 is disposed to face one main surface of the magnetic field generator 3 and to be separate from one main surface of the magnetic field generator 3. An arrangement portion 9 having a circular shape in the plan view is provided at the inside of the movable portion 6. The mirror 2 is disposed on the arrangement portion 9. That is, the mirror 2 is provided with the movable portion 6. The frame 4, the support portion 5, the movable portion 6, the pair of connection portions 7, and the pair of connection portions 8 are integrally formed of, for example, silicon (Si).

The actuator device 1 further includes, as illustrated in FIG. 2, the coil 11 provided with the support portion 5 and the coil 12 provided with the movable portion 6. The coil 11 is buried in the support portion 5 and the coil 12 is buried in the movable portion 6. Each of the coils 11 and 12 is formed of, for example, a metal material such as copper (Cu). In FIG. 2, each wiring is indicated by a solid line in order to facilitate understanding, but the wirings like the coils 11 and 12 are covered by an insulation layer 52 and/or an insulation layer 53 which will be described later.

The coil 11 is wound a plurality of turns in a spiral shape in the plan view. One end of a wiring 14a is electrically connected to an inner end of the coil 11. One end of a wiring 14b is electrically connected to an outer end of the coil 11. Each of the wirings 14a and 14b is formed of, for example, a metal material such as aluminum. Each of the wirings 14a and 14b is provided on one connection portion 7 and extends from the support portion 5 to the frame 4. The other end of the wiring 14a is electrically connected to an electrode 15a provided with the support portion 5 and the other end of the wiring 14b is electrically connected to an electrode 15b provided with the support portion 5. Each of the electrodes 15a and 15b is electrically connected to a control circuit or the like. The wiring 14a three-dimensionally intersects the coil 11 to pass over the coil 11.

The coil 12 is wound a plurality of turns in a spiral shape in the plan view. One end of a wiring 16a is electrically connected to an inner end of the coil 12. One end of a wiring 16b is electrically connected to an outer end of the coil 12. Each of the wirings 16a and 16b is provided on the pair of connection portions 8, the support portion 5, and the other connection portion 7 and extends from the movable portion 6 to the frame 4. The other end of the wiring 16a is electrically connected to an electrode 17a provided with the support portion 5 and the other end of the wiring 16b is electrically connected to an electrode 17b provided with the support portion 5. Each of the electrodes 17a and 17b is electrically connected to a control circuit or the like. The wiring 16a three-dimensionally intersects the coil 12 to pass over the coil 12.

Each of the wirings 16a and 16b includes a first wiring 21 provided on each connection portion 8, a second wiring 31 provided on the support portion 5, and a third wiring 41 provided on the movable portion 6. Hereinafter, the configurations of the first wiring 21, the second wiring 31, and the third wiring 41 in the vicinity of one connection portion 8 will be described with reference to FIGS. 3, 4, and 5. Because the configurations of the first wiring 21 and the like in the vicinity of the other connection portion 8 are the same as the configurations of the first wiring 21 and the like in the vicinity of one connection portion 8, a description thereof will be omitted. The insulation layer 52 (see FIGS. 4 and 5) is omitted in FIG. 3.

The first wiring 21 is formed of a first metal material. The first wiring 21 is provided over the support portion 5, the connection portion 8, and the movable portion 6. The first wiring 21 includes a first portion 22, a second portion 23, and a third portion 24. The first portion 22 extends along the second axis X2 on the support portion 5, the connection portion 8, and the movable portion 6. The second portion 23 extends from an end on the side of the support portion 5 in the first portion 22 to the other connection portion 7 on the support portion 5. The third portion 24 extends from an end on the side of the movable portion 6 in the first portion 22 to the one connection portion 7 on the movable portion 6. The extension direction of the first portion 22 and the extension direction of the second portion 23 are orthogonal to each other and the extension direction of the first portion 22 and the extension direction of the third portion 24 are orthogonal to each other.

The first wiring 21 is electrically connected to the second wiring 31 in a first connection part 25 located at an end on the support portion 5. The first wiring 21 is electrically connected to the third wiring 41 in a second connection part 26 located at an end on the movable portion 6. The first connection part 25 is separate from the second axis X2 by a predetermined distance D1. The distance D1 is larger than ½ times the minimum width W0 of the connection portion 8. The second connection part 26 is separate from the second axis X2 by a predetermined distance D2. The distance D2 is larger than ½ times the minimum width W0 of the connection portion 8. The first portion 22, the second portion 23, and the third portion 24 have the same width. The width W1 of the first wiring 21 is ½ times or more the minimum width W0 of the connection portion 8 and is ⅔ times or more in this example. Here, the width W1 of the first wiring 21 indicates the length of the first wiring 21 in a direction orthogonal to the extension direction of the first wiring 21 in the plan view. In the first portion 22, the width indicates the length of the first portion 22 in a direction orthogonal to the second axis X2 in the plan view. Additionally, the width W1 of the first wiring 21 is, for example, about 50 to 100 µm.

The second wiring 31 is formed of a second metal material. One end of the second wiring 31 is electrically connected to the first wiring 21. The other end of the second wiring 31 is electrically connected to the electrode 17a. A wide portion 32 which has a width larger than that of the other portion is provided at one end of the second wiring 31. The second wiring 31 is electrically connected to the first connection part 25 of the first wiring 21 in the wide portion 32.

The third wiring 41 is formed of a third metal material. One end of the third wiring 41 is electrically connected to the first wiring 21. The other end of the third wiring 41 is electrically connected to the coil 12. A wide portion 42 having a width larger than that of the other portion is provided at one end of the third wiring 41. The third wiring 41 is electrically connected to the second connection part 26 of the first wiring 21 in the wide portion 42.

The rigidity of the first metal material forming the first wiring 21 is higher than the rigidity of the second metal material forming the second wiring 31. The rigidity of the first metal material forming the first wiring 21 is higher than the rigidity of the third metal material forming the third wiring 41. In other words, the rigidity of the second metal material forming the second wiring 31 is lower than the rigidity of the first metal material forming the first wiring 21. The rigidity of the third metal material forming the third wiring 41 is lower than the rigidity of the first metal material forming the first wiring 21. Examples of a combination of the first metal material and the second metal material are a combination of tungsten (W) (the first metal material) and aluminum (the second metal material), a combination of tungsten (the first metal material) and copper (the second metal material), a combination of tungsten (the first metal material) and gold (the second metal material), and the like. Examples of a combination of the first metal material and the third metal material are a combination of tungsten (W) (the first metal material) and aluminum (the third metal material), a combination of tungsten (the first metal material) and copper (the third metal material), a combination of tungsten (the first metal material) and gold (the third metal material), and the like. The first metal material may be an aluminum alloy (AL-Cu or the like), nickel (Ni), platinum (Pt), or the like.

In the actuator device 1, the width W1 of the first wiring 21 is larger than each of the width W2 of the second wiring 31 and the width W3 of the third wiring 41. The thickness of the first wiring 21 is the same as each of the thickness of the second wiring 31 and the thickness of the third wiring 41. Thus, the cross-sectional area of the first wiring 21 is larger than each of the cross-sectional area of the second wiring 31 and the cross-sectional area of the third wiring 41. Here, the width W2 of the second wiring 31 means the length of the second wiring 31 (excluding the wide portion 32) in a direction orthogonal to the extension direction of the second wiring 31 in the plan view. The width W3 of the third wiring 41 means the length of the third wiring 41 (excluding the wide portion 42) in a direction orthogonal to the extension direction of the third wiring 41 in the plan view. The cross-sectional area of the first wiring 21 means an area of a cross-section orthogonal to the extension direction of the first wiring 21. The cross-sectional area of the second wiring 31 means an area of a cross-section orthogonal to the extension direction of the second wiring 31. The cross-sectional area of the third wiring 41 means an area of a cross-section orthogonal to the extension direction of the third wiring 41. Additionally, the width of the second wiring 31 is, for example, about 5 to 10 μm.

Figure 4:
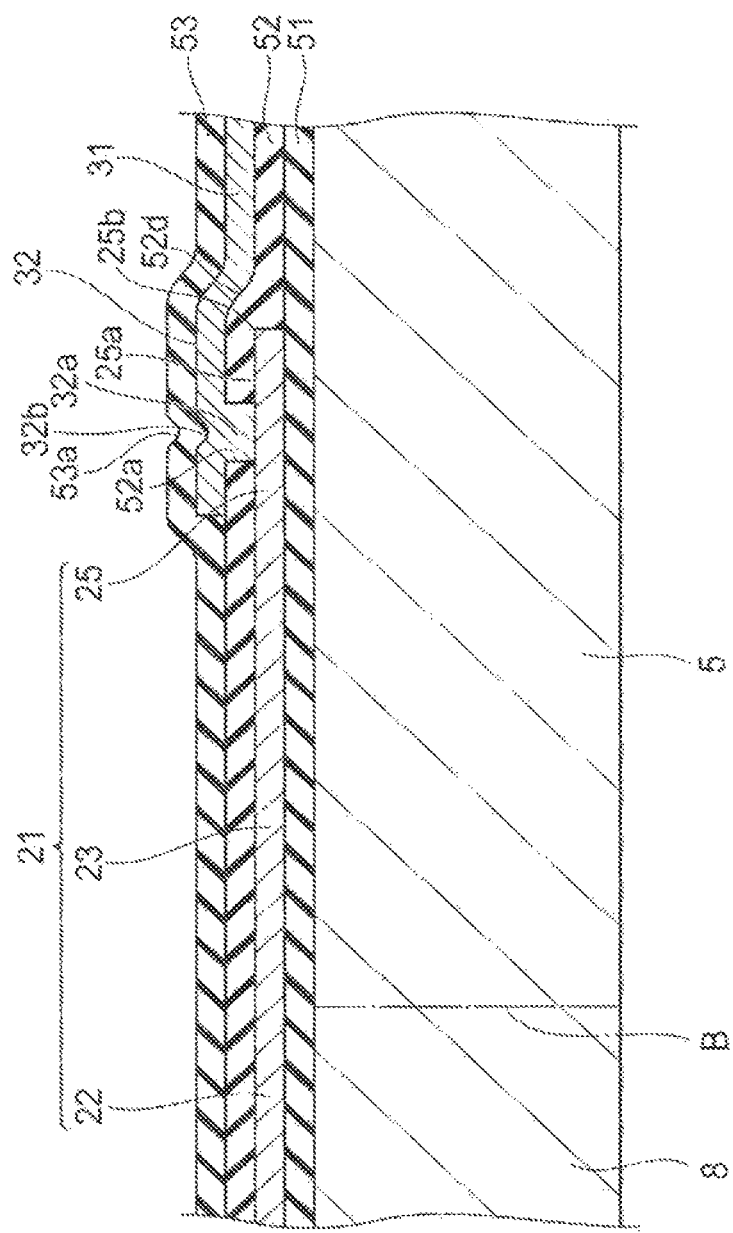
FIG. 4 is a cross-sectional view taken along a line IV-IV of FIG. 3.

As illustrated in FIG. 4, the actuator device 1 further includes insulation layers 51, 52, and 53. Each of the insulation layers 51, 52, and 53 is, for example, a silicon oxide film ($SiO_2$).

The insulation layer 51 is provided on the surfaces of the frame 4, the support portion 5, the movable portion 6, the pair of connection portions 7, and the pair of connection portions 8. The first wiring 21 is provided on the insulation layer 51. That is, the first wiring 21 is provided on the support portion 5 via the insulation layer 51.

The insulation layer 52 is provided on the insulation layer 51 so as to cover the first wiring 21. The insulation layer 52 is provided over the frame 4, the support portion 5, the movable portion 6, the pair of connection portions 7, and the pair of connection portions 8. The insulation layer 52 includes a first opening 52a which exposes a surface 25a opposite to the support portion 5 in the first connection part 25. The first opening 52a is a hole having a circular shape in the plan view. The first opening 52a is separate from a corner 25b of the first connection part 25 by a predetermined distance. The insulation layer 52 covers the corner 25b of the first connection part 25. A region 53d corresponding to the corner 25b in the surface opposite to the support portion 5 in the insulation layer 52 is curved in a convex shape toward the opposite side of the support portion 5. Here, the corner 25b of the first connection part 25 means a portion along an outer edge of the surface 25a in the first connection part 25 (i.e. a portion in which at least two surfaces of the first connection part 25 intersect each other).

The second wiring 31 is provided on the insulation layer 52. That is, the second wiring 31 is provided on the support portion 5 via the insulation layers 51 and 52. The wide portion 32 of the second wiring 31 runs on the first connection part 25 to cover the first opening 52a. A part 32a of the wide portion 32 is disposed inside the first opening 52a and is connected to the surface 25a of the first connection part 25 in the first opening 52a. The wide portion 32 includes a concave portion 32b at a position corresponding to the first opening 52a in the surface opposite to the support portion 5. The concave portion 32b is formed such that a part 32a of the wide portion 32 enters the first opening 52a at the time of forming the second wiring 31.

An electric connection structure between the first wiring 21 and the third wiring 41 is the same as the above-described electric connection structure between the first wiring 21 and the second wiring 31. That is, as illustrated in FIG. 3, the insulation layer 52 includes a second opening 52b which exposes a surface 26a opposite to the movable portion 6 in the second connection part 26. The second opening 52b is a hole having a circular shape in the plan view. The second opening 52b is separate from a corner 26b of the second connection part 26 by a predetermined distance. The insulation layer 52 covers the corner 26b of the second connection part 26. A region corresponding to the corner 26b in the surface opposite to the movable portion 6 in the insulation layer 52 is curved in a convex shape toward the opposite side to the movable portion 6. Here, the corner 26b of the second connection part 26 means a portion along an outer edge of the surface 26a of the second connection part 26 (i.e. a portion in which at least two surfaces of the second connection part 26 intersect each other).

The third wiring 41 is provided on the insulation layer 52. That is, the third wiring 41 is provided on the movable portion 6 via the insulation layers 51 and 52. The wide portion 42 of the third wiring 41 runs on the second connection part 26 to cover the second opening 52b. A part of the wide portion 42 is disposed inside the second opening 52b and is connected to the surface 26a of the second connection part 26 in the second opening 52b. The wide portion 42 includes a concave portion at a position corresponding to the second opening 52b in the surface opposite to the support portion 5. The concave portion is formed such that a part of the wide portion 42 enters the second opening 52b at the time of forming the third wiring 41.

The insulation layer 53 is provided on the insulation layer 52 to cover the second wiring 31 and the third wiring 41. The insulation layer 53 is provided over the frame 4, the support portion 5, the movable portion 6, the pair of connection portions 7, and the pair of connection portions 8. The insulation layer 53 includes a concave portion 53a at a position corresponding to the first opening 52a in the surface opposite to the support portion 5. The concave portion 53a is formed such that a part of the insulation layer 53 enters the concave portion 32b at the time of forming the insulation layer 53. The insulation layer 53 includes a concave portion at a position corresponding to the second opening 52b in the surface opposite to the support portion 5. The concave portion of the insulation layer 53 is formed such that a part of the insulation layer 53 enters the concave portion of the wide portion 42 at the time of forming the insulation layer 53.

Figure 5:
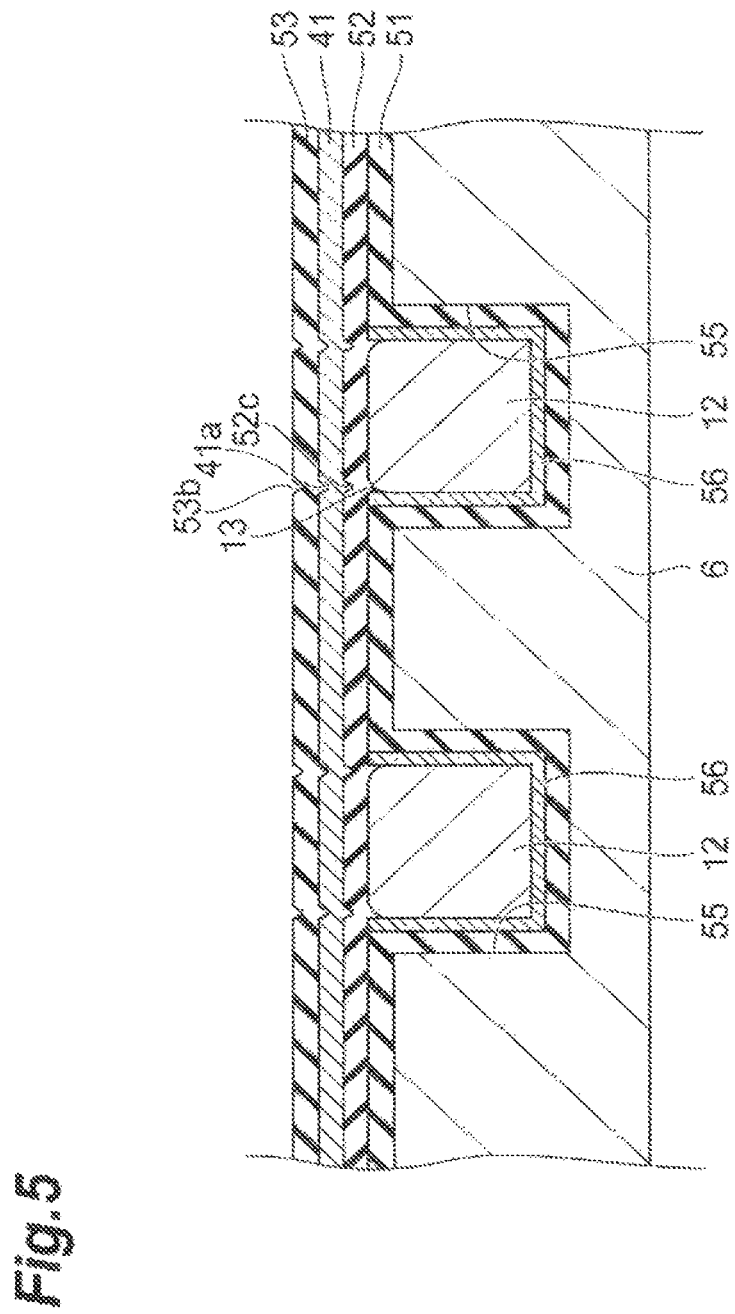
FIG. 5 is a cross-sectional view taken along a line V-V of FIG. 3.

As illustrated in FIG. 5, the movable portion 6 is provided with a groove portion 55 having a shape corresponding to the coil 12. An inner surface of the groove portion 55 is provided with the insulation layer 51. A seed layer 56 is provided on the insulation layer 51 inside the groove portion 55. The seed layer 56 is formed of for example, titanium nitride (TiN). The coil 12 is disposed inside the groove portion 55 via the insulation layer 51 and the seed layer 56. The coil 12 is formed by burying, for example, a metal material such as copper in the groove portion 55 according to, for example, a damascene method. The insulation layer 52 is provided to cover the coil 12 disposed inside the groove portion 55. The third wiring 41 is electrically connected to the coil 12 via an opening provided with the insulation layer 52 so that an inner end of the coil 12 is exposed.

A groove portion 13 is formed along the boundary between the seed layer 56 and the surface on the side of the insulation layer 52 in the coil 12 at the time of forming the coil 12. The insulation layer 52 includes a groove portion 52c at a position corresponding to the groove portion 13 in the surface opposite to the movable portion 6. The groove portion 52c is formed such that a part of the insulation layer 52 enters the groove portion 13 at the time of forming the insulation layer 52. The third wiring 41 includes a groove portion 41a at a position corresponding to the groove portion 12a in the surface opposite to the movable portion 6. The groove portion 41a is formed such that a part of the third wiring 41 enters the groove portion 52c at the time of forming the third wiring 41. The insulation layer 53 includes a groove portion 53b at a position corresponding to the groove portion 12a in the surface opposite to the movable portion 6. The groove portion 53b is formed such that a part of the insulation layer 53 enters the groove portion 41a at the time of forming the insulation layer 53.

In the actuator device 1, when a current flows to the coil 11, a Lorentz force is generated in a predetermined direction by electrons flowing in the coil 11 by a magnetic field generated by the magnetic field generator 3. Accordingly, the coil 11 receives a force in a predetermined direction. For this reason, it is possible to swing the support portion 5 about the first axis X1 by controlling the direction or the magnitude of the current flowing in the coil 11. Similarly, it is possible to swing the movable portion 6 about the second axis X2 by controlling the direction or the magnitude of the current flowing in the coil 12. Thus, it is possible to swing the mirror 2 about each of the first axis X1 and the second axis X2 which are orthogonal to each other by controlling the direction or the magnitude of the current flowing in the coil 11 and the coil 12. Further, it is possible to swing the movable portion 6 at a high speed at the resonance frequency level by applying a current having a frequency corresponding to the resonance frequency of the movable portion 6 to the coil 12.

In the above-described actuator device 1, the rigidity of the first metal material forming the first wiring 21 provided on the connection portion 8 is higher than the rigidity of the second metal material forming the second wiring 31 provided on the support portion 5. Accordingly, deterioration of the first wiring 21 provided on the connection portion 8 is suppressed. Also, it is possible to suppress the deformation (curving or the like) of the support portion 5 caused when the entire wiring provided on the connection portion 8 and the support portion 5 is formed of the first metal material having high rigidity. Further, the first wiring 21 and the second wiring 31 are connected to each other at the first connection part 25 located on the support portion 5. Accordingly, stress applied to the first connection part 25 is reduced and deterioration of the first connection part 25 is suppressed. Further, in the actuator device 1, the corner 25b of the first connection part 25 is covered by the insulation layer 52 and the first wiring 21 and the second wiring 31 are connected to each other in the surface 25a opposite to the support portion 5 in the first connection part 25 exposed by the first opening 52a of the insulation layer 52. Accordingly, because stress applied from the first wiring 21 to the second wiring 31 is reduced by the insulation layer 52, deterioration of the second wiring 31 formed of the second metal material of which the rigidity is lower than that of the first metal material is suppressed. Thus, according to the actuator device 1, it is possible to suppress deterioration of the wirings 16a and 16b provided on the connection portion 8 and the support portion 5. Further, because the first wiring 21 and the second wiring 31 are directly connected to each other, it is possible to reduce the resistance of the wirings 16a and 16b provided on the connection portion 8 and the support portion 5.

In the actuator device 1, the first connection part 25 is separate from the second axis X2 by a predetermined distance D. Accordingly, it is possible to reduce stress applied to the first connection part 25 while securing a region for providing another configuration (for example, the coil 11) on the support portion 5. That is, it is possible to secure a region for providing another configuration on the support portion 5 compared to a case in which stress applied to the first connection part 25 is reduced by securing a distance along the second axis X2 between the first connection part 25 and the connection portion 8.

In the actuator device 1, the distance D is larger than ½ times the minimum width W0 of the connection portion 8. Accordingly, it is possible to further reduce stress applied to the first connection part 25 while securing a region for providing another configuration on the support portion 5.

In the actuator device 1, the cross-sectional area of the first wiring 21 is larger than the cross-sectional area of the second wiring 31. Accordingly, it is possible to suppress an increase in resistance value of the first wiring 21 even when the resistivity of the first metal material forming the first wiring 21 is higher than the resistivity of the second metal material forming the second wiring 31.

In the actuator device 1, the width of the first wiring 21 is larger than the width of the second wiring 31. Accordingly, it is possible to suppress an increase in resistance value of the first wiring 21 by securing the cross-sectional area of the first wiring 21 while suppressing the torsion of the connection portion 8 from being obstructed.

In the actuator device 1, the first opening 52a is separate from the corner 25b of the first connection part 25. Accordingly, it is possible to reliably reduce stress applied from the first wiring 21 to the second wiring 31.

In the actuator device 1, the region 53d corresponding to the corner 25b in the surface opposite to the support portion 5 in the insulation layer 52 is curved in a convex shape toward the opposite side to the support portion. Accordingly, it is possible to further reduce stress applied from the first wiring 21 to the second wiring 31.

In the actuator device 1, the rigidity of the first metal material forming the first wiring 21 provided on the connection portion 8 is higher than the rigidity of the third metal material forming the third wiring 41 provided on the movable portion 6. Further, the first wiring 21 and the third wiring 41 are connected to each other in the second connection part 26 located on the movable portion 6. Further, the corner 26b of the second connection part 26 is covered by the insulation layer 52 and the first wiring 21 and the third wiring 41 are connected to each other in the surface 26a opposite to the movable portion 6 in the second connection part 26 exposed by the second opening 52b of the insulation layer 52. Thus, it is possible to suppress deterioration of the wirings 16a and 16b provided on the connection portion 8 and the movable portion 6.

The actuator device 1 further includes the frame 4 which supports the support portion 5 and the movable portion 6 and the support portion 5 is connected to the frame 4 to be swingable about the first axis X1 orthogonal to the second axis X2. Accordingly, it is possible to swing the movable portion 6 about each of two orthogonal axes.

The actuator device 1 further includes the mirror 2 provided with the movable portion 6. Accordingly, it is possible to use the mirror 2 for the light scanning or the like by swinging the mirror about each of the first axis XL and the second axis X2.

In the actuator device 1, the second wiring 31 is connected to the surface 25a opposite to the support portion 5 in the first connection part 25 located on the support portion 5 in the first wiring 21. Accordingly, because the stress applied from the first wiring 21 to the second wiring 31 is released to the opposite side to the support portion 5, it is possible to suppress deterioration of the second wiring 31 formed of the second metal material having rigidity lower than that of the first metal material. That is, it is possible to prevent a problem in which the stress applied from the second wiring 31 to the first wiring 21 and the reaction force from the support portion 5 intensively act on the end of the second wiring 31, which happens in a case in which the end of the second wiring 31 is interposed between the first wiring 21 and the support portion 5. Also with this configuration, according to the actuator device 1, it is possible to suppress deterioration of the wirings 16a and 16b provided on the connection portion 8 and the support portion 5.

Figure 6:
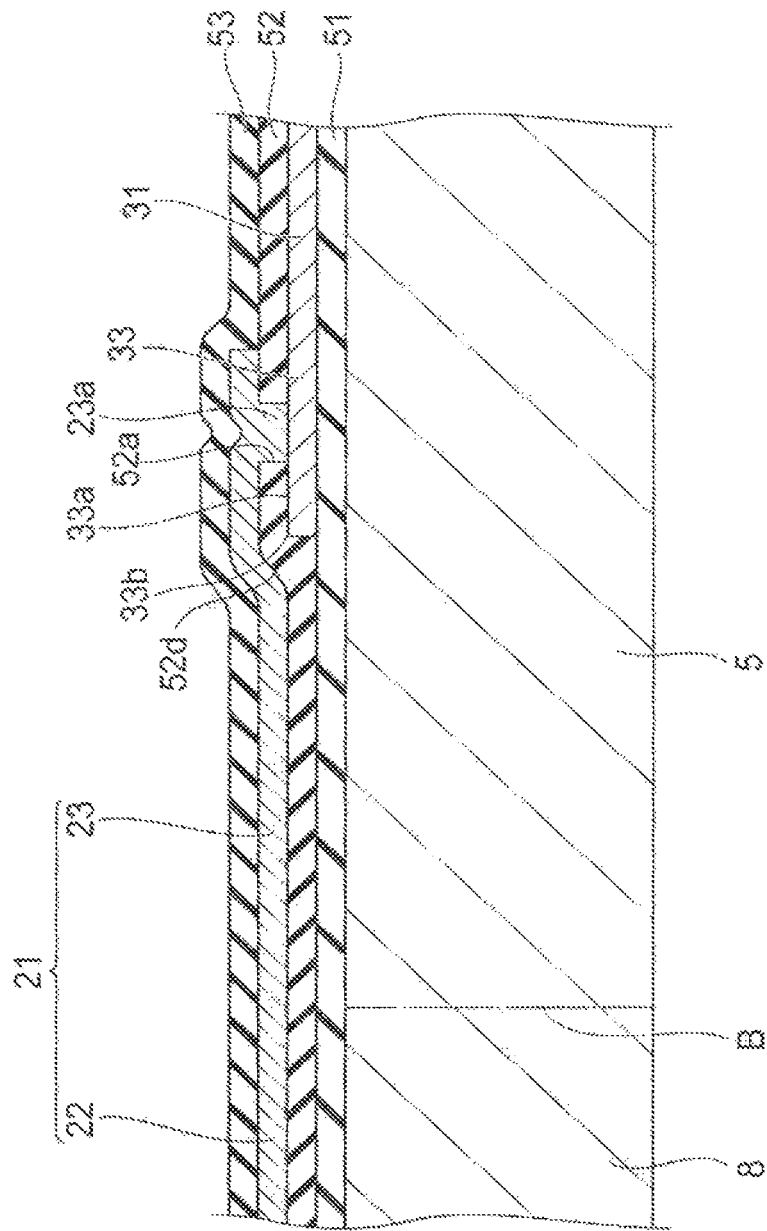
FIG. 6 is a cross-sectional view of a first connection part of an actuator device of a first modified example.

While the embodiment of the present disclosure has been described above, an embodiment of the present disclosure is not limited to the above-described embodiment. For example, the second wiring 31 may be electrically connected to the first wiring 21 in the first connection part 33 located at the end on the support portion 5 similarly to a first modified example illustrated in FIG. 6. In the first modified example, the second wiring 31 is provided on the insulation layer 51. The insulation layer 52 is provided on the insulation layer 51 to cover the second wiring 31. The insulation layer 52 includes the first opening 52a which exposes a surface 33a opposite to the support portion 5 in the first connection part 33. The insulation layer 52 includes a corner 33b of the first connection part 33. The region 53d corresponding to the corner 25b in the surface opposite to the support portion 5 in the insulation layer 52 is curved in a convex shape toward the opposite side to the support portion 5. The first wiring 21 is provided on the insulation layer 52. The end of the second portion 23 in the first wiring 21 runs on the first connection part 33 to cover the first opening 52a. A part 23a of the second portion 23 is disposed inside the first opening 52a and is connected to the surface 33a of the first connection part 33 in the first opening 52a. Also in the first modified example, it is possible to suppress deterioration of the wirings 16a and 16b provided on the connection portion 8 and the support portion 5 similarly to the above-described embodiment. Further, the third wiring 41 may be electrically connected to the first wiring 21 in the second connection part 26 located at the end on the movable portion 6 similarly to the first modified example.

Figure 7:
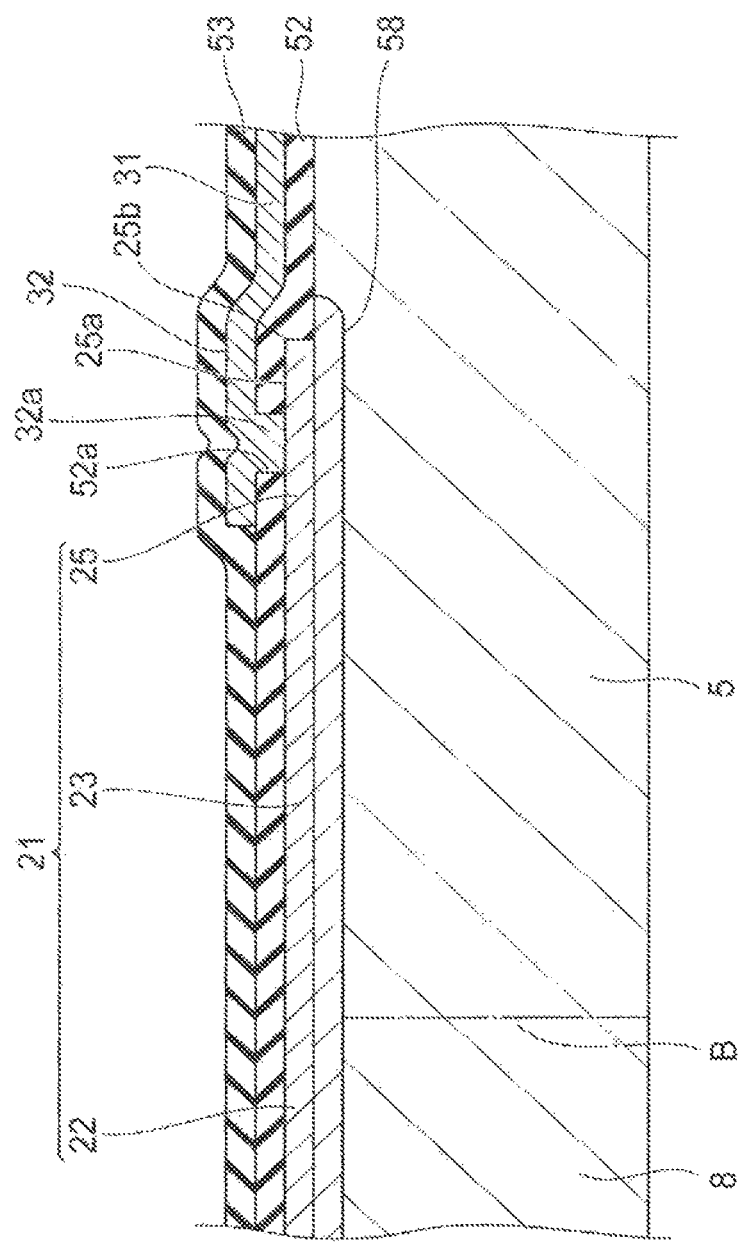
FIG. 7 is a cross-sectional view of a first connection part of an actuator device of a second modified example.

Similarly to a second modified example illustrated in FIG. 7, a diffusion layer 58 may be provided instead of the insulation layer 51. The diffusion layer 58 is provided with a region contacting the first wiring 21 on the surfaces of the support portion 5, the movable portion 6, and the pair of connection portions 8. The diffusion layer 58 is, for example, a diffusion region formed by diffusing a p-type impurity on a surface of an n-type silicon substrate. Also in the second modified example, it is possible to suppress deterioration of the wirings 16a and 16b provided on the connection portion 8 and the support portion 5 similarly to the above-described embodiment. Further, according to the second modified example, because the diffusion layer 58 serves as a part of the first wiring 21, it is possible to reduce the resistance of the wirings 16a and 16b provided on the connection portion 8 and the support portion 5 while securing the insulation at the diffusion layer 58. Further, when the first metal material is tungsten, the first wiring 21 can be stably provided on the connection portion 8 because tungsten easily adheres to the diffusion layer 58.

Figure 8:
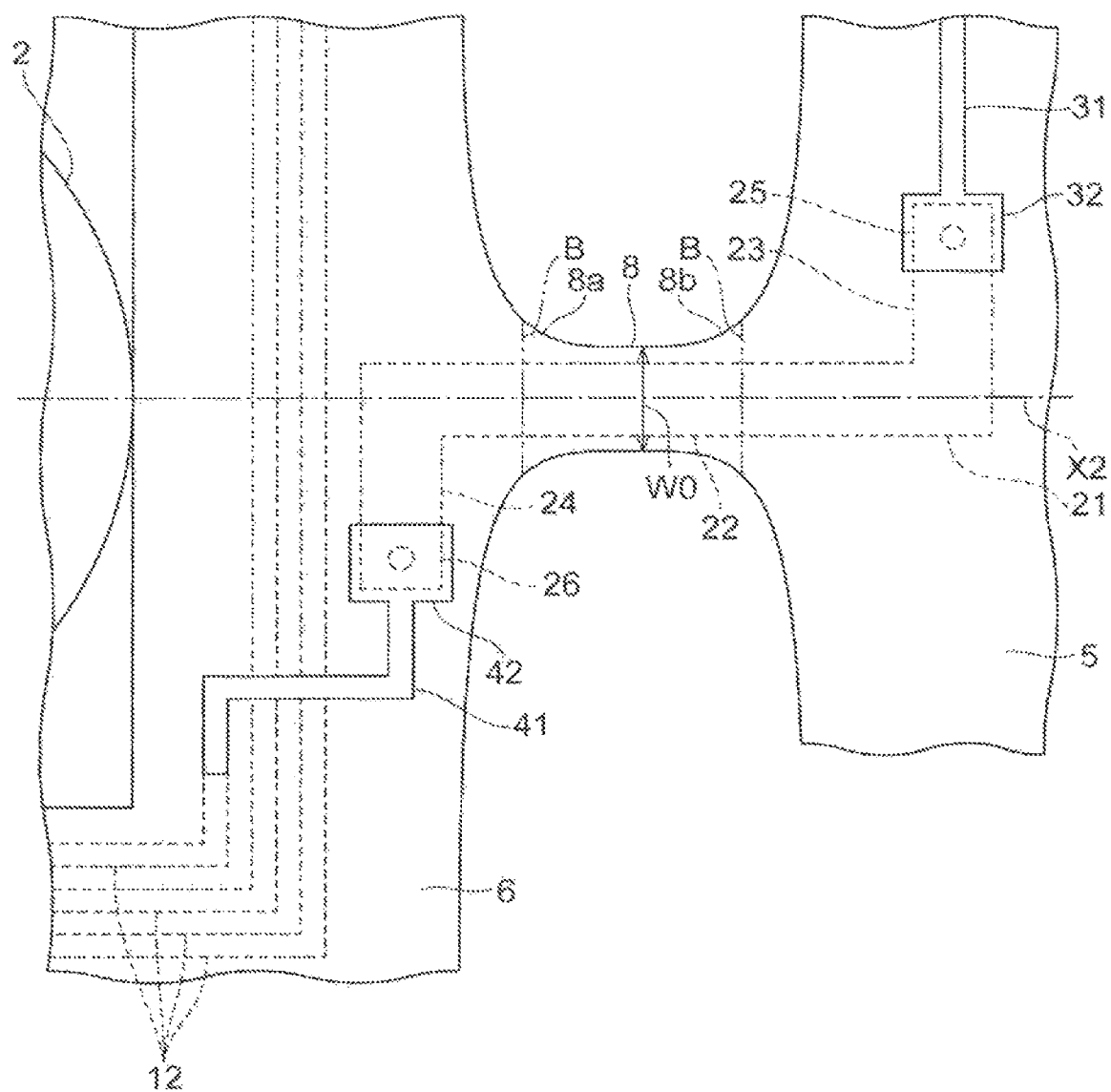
FIG. 8 is a partially enlarged view of an actuator device of a third modified example.

Similarly to a third modified example illustrated in FIG. 8, an end 8b on the side of the support portion 5 in each connection portion 8 may increase in width as it approaches the support portion 5. In FIG. 8, a boundary B between the connection portion 8 and the support portion 5 and a boundary B between the connection portion 8 and the movable portion 6 are indicated by a two-dotted chain line. Also in the third modified example, it is possible to suppress deterioration of the wirings 16a and 16b provided on the connection portion 8 and the support portion 5 similarly to the above-described embodiment.

In the above-described embodiment, the first wiring 21, the second wiring 31, and the third wiring 41 may be provided with the connection portion 7 as well as the connection portion 8. In this case, the first wiring 21 is provided on the connection portion 7 and the second wiring 31 is provided on the frame 4 to be electrically connected to the electrodes 15a and 15b or the electrodes 17a and 17b. Then, the third wiring 41 is provided on the support portion 5 to be electrically connected to the coil 11 or the second wiring 31 of the above-described embodiment. The connection portion 7 may have a linear shape. The connection portion 8 may have an arbitrary shape as long as the movable portion 6 is connected to the support portion 5 on the second axis X2 so that the movable portion 6 is swingable about the second axis X2.

In the above-described embodiment, the insulation layer 52 is provided over the frame 4, the support portion 5, the movable portion 6, the pair of connection portions 7, and the pair of connection portions 8, but may be provided at least so as to be interposed between at least the first wiring 21 and the second wiring 31 or the third wiring 41. The shapes of the first opening 52a and the second opening 52b are not limited to circular shapes. The first opening 52a and the second opening 52b may have, for example, a rectangular shape, a rhombic shape, or the like. Further, the first opening 52a and the second opening 52b may have, for example, a notch shape opened to the extension direction of the second portion 23 or the third portion 24.

A part of the first opening 52a may contact the corner 25b of the first connection part 25. Also with this configuration, because the corner 25b is covered by the insulation layer 52, it is possible to reduce stress applied from the first wiring 21 to the second wiring 31 similarly to the above-described embodiment. A part of the second opening 52b may contact the corner 26b of the second connection part 26. Also with this configuration, because the corner 26b is covered by the insulation layer 52, it is possible to reduce stress applied from the first wiring 21 to the second wiring 31 similarly to the above-described embodiment. A region corresponding to the corner 25b in the surface opposite to the support portion 5 in the insulation layer 52 may not be curved in a convex shape and may be curved in, for example, a plane shape. Also with this configuration, it is possible to reduce stress applied from the first wiring 21 to the second wiring 31 similarly to the above-described embodiment. A region corresponding to the corner 26b in the surface opposite to the movable portion 6 in the insulation layer 52 may not be curved in a convex shape and may be curved in, for example, a plane shape. Also with this configuration, it is possible to reduce stress applied from the first wiring 21 to the second wiring 31 similarly to the above-described embodiment.

The first connection part 25 may be separate from the second axis X2 by a predetermined distance and may not be separated therefrom by the distance D1 larger than ½ times the minimum width W0 of the connection portion 8. Similarly, the second connection part 26 may be separate from the second axis X2 by a predetermined distance and may not be separated therefrom by the distance D2 larger than ½ times the minimum width W0 of the connection portion 8. The second wiring 31 may not be provided with the wide portion 32 and the third wiring 41 may not be provided with the wide portion 42. The third wiring 41 may be electrically connected to the coil 12 via another member formed of a metal material.

In the first wiring 21, the first portion 22 and the second portion 23 or the third portion 24 may intersect each other at an angle other than the perpendicular direction. Alternatively, the whole first wiring 21 may straightly extend along the extension direction of the connection portion. In this case, the first connection part 25 is located on the second axis X2. The first portion 22, the second portion 23, and the third portion 24 may not have the same width. In this case, the width of the first wiring 21 means the minimum width or the maximum width of the first portion 22, the second portion 23, and the third portion 24.

The cross-sectional area of the first wiring 21 may be larger than the cross-sectional area of the second wiring 31 and the width W1 of the first wiring 21 may be smaller than the width W2 of the second wiring 31. For example, the thickness of the first wiring 21 may be larger than the thickness of the second wiring 31, and thus the cross-sectional area of the first wiring 21 may be larger than the cross-sectional area of the second wiring 31. Here, the above-described embodiment is preferable in that the torsion of the connection portion 8 can be prevented and the manufacturing can be facilitated. Similarly, the cross-sectional area of the first wiring 21 may be larger than the cross-sectional area of the third wiring 41 and the width W1 of the first wiring 21 may be smaller than the width W3 of the third wiring 41. The cross-sectional area of the first wiring 21 may be equal to or smaller than the cross-sectional area of the second wiring 31 or the third wiring 41.

The actuator device 1 may be used to drive an object other than the mirror 2. The shape of the mirror 2 is not limited to the circular shape. The mirror 2 may have, for example, a rectangular shape, a rhombic shape, or the like. In the above-described embodiment, the swinging (driving) of the mirror 2 is performed by an electromagnetic force, but may be performed by, for example, a piezoelectric element. In this case, a wiring for applying a voltage to the piezoelectric element is provided instead of the coils 11 and 12. The magnetic field generator 3 may be omitted.

The first axis X1 and the second axis X2 may not be orthogonal to each other and may intersect each other. The actuator device 1 may swing only about the second axis X2. In this case, the frame 4 and the connection portion 7 may be omitted and an electrode to be electrically connected to a control circuit or the like may be provided with the support portion 5. The connection portion 8 may be a region where the width is smaller than 2 times the minimum, width W0. Alternatively, the connection portion 8 may be a region where the stress applied during the swing of the movable portion 6 with respect to the support portion 5 is larger than ½ times the maximum stress.

In the above-described embodiment, the insulation layer 52 covers the entire corner 25b of the first connection part 25, but may cover at least a part of the corner 25b. For example, the insulation layer 52 may cover at least a portion of the corner 25b in the first connection part 25 where the surface 25a opposite to the support portion 5 intersects the surface (in the above-described embodiment, the surface on the side of the other connection portion 7) on the side to which the second wiring 31 is drawn out. Even when the insulation layer 52 covers only a portion in which the surface 25a opposite to the support portion 5 intersects the surface in which the second wiring 31 in the first connection part 25 is drawn in the corner 25b, it is possible to suppress deterioration of the wirings 16a and 16b provided on the connection portion 8 and the support portion 5 similarly to the above-described embodiment. The second wiring 31 may be drawn along the second axis X2 from, for example, the first connection part 25. Similarly to the corner 26b of the second connection part 26, the insulation layer 52 may cover at least a part of the corner 26b.

REFERENCE SIGNS LIST

1 . . . actuator device, 2 . . . mirror, 3 . . . magnetic field generator, 4 . . . frame, 5 . . . support portion, 6 . . . movable portion, 8 . . . connection portion, 12 . . . coil, 21 . . . first wiring, 25, 33 . . . first connection part, 25a, 33a . . . surface, 25b, 33b . . . corner, 26 . . . second connection part, 26a . . . surface, 26b . . . corner, 31 . . . second wiring, 41 . . . third wiring, 52 . . . insulation layer, 52a . . . first opening, 52b . . . second opening.

The invention claimed is:

1. An actuator device comprising:
a frame;
a support portion formed in a frame shape and located at the inside of the frame;
a movable portion located at the inside of the support portion;
a coil disposed at the movable portion;
a first connection portion which connects the movable portion to the support portion so that the movable portion is swingable; and
a second connection portion which connects the support portion to the frame so that the support portion is swingable,
wherein the first connection portion is formed with a first wiring which includes an impurity layer of a first conductivity type,
wherein the first wiring is electrically connected to the coil,
wherein the first wiring includes a first portion located at the first connection portion and a second portion located at the movable portion, and
wherein the coil is made of a metal material and is electrically connected to the second portion of the first wiring.

2. An actuator device according to claim 1,
wherein the first connection portion includes a region of a second conductivity type.

3. An actuator device according to claim 1,
wherein a second wiring formed of a metal material is provided on the support portion and the second connection portion and the first wiring and the second wiring are electrically connected to each other.

4. An actuator device according to claim 3,
wherein the second wiring includes a widened portion at an end electrically connected to the first wiring.

5. An actuator device according to claim 1,
wherein an end on a side of the movable portion in the first connection portion increases in width as it approaches the movable portion and/or an end on a side of the support portion in the first connection portion increases in width as it approaches the support portion.

6. An actuator device according to claim 1,
wherein the actuator device is configured such that the movable portion swings at resonance frequency thereof.

7. An actuator device according to claim 3,
wherein a total length of the second wiring is longer than a total length of the first wiring.

8. An actuator device according to claim 3,
wherein the first wiring and the second wiring are electrically connected to each other via a metal layer.

9. An actuator device comprising:
a frame;
a support portion formed in a frame shape and located at the inside of the frame;
a movable portion located at the inside of the support portion;
a coil disposed at the movable portion;
a first connection portion which connects the movable portion to the support portion so that the movable portion is swingable; and
a second connection portion which connects the support portion to the frame so that the support portion is swingable,
wherein the first connection portion is formed with a first wiring which includes an impurity layer of a first conductivity type,
wherein the first wiring is electrically connected to the coil,
wherein a second wiring formed of a metal material is provided on the support portion and the second connection portion, and the first wiring and the second wiring are electrically connected to each other, and
wherein the first wiring includes a first portion located at the first connection portion and a second portion located at the support portion, and the first wiring is electrically connected to the second wiring at the second portion.

10. An actuator device according to claim 9,
wherein the second portion of the first wiring includes a part extending in a direction intersecting with an extending direction of the first connection portion.

11. An actuator device according to claim 9,
wherein the first wiring includes a third portion located at the movable portion and the third portion of the first wiring includes a part extending in a direction intersecting with an extending direction of the first connection portion.

12. An actuator device comprising:
a frame;
a support portion formed in a frame shape and located at the inside of the frame;
a movable portion located at the inside of the support portion;
a first connection portion which connects the movable portion to the support portion so that the movable portion is swingable; and
a second connection portion which connects the support portion to the frame so that the support portion is swingable,
wherein the first connection portion is formed with a first wiring which includes an impurity layer of a first conductivity type, and
wherein the first connection portion has a linear shape and the second connection portion has a meandering shape.

13. An actuator device comprising:
a frame;
a support portion formed in a frame shape and located at the inside of the frame;
a movable portion located at the inside of the support portion;
a coil disposed at the movable portion;
a first connection portion which connects the movable portion to the support portion so that the movable portion is swingable;
a second connection portion which connects the support portion to the frame so that the support portion is swingable; and
another first connection portion which connects the movable portion to the support portion so that the movable portion is swingable,
wherein the first connection portion is formed with a first wiring which includes an impurity layer of a first conductivity type,
wherein the first wiring is electrically connected to the coil, and
wherein the other first connection portion is formed with another first wiring which includes an impurity layer of a first conductivity type.

14. An actuator device according to claim 13,
wherein the first connection portion includes a region of a second conductivity type.

15. An actuator device according to claim 13,
wherein a second wiring formed of a metal material is provided on the support portion and the second connection portion, and the first wiring and the second wiring are electrically connected to each other.

16. An actuator device according to claim 13,
wherein an end on a side of the movable portion in the first connection portion increases in width as it approaches the movable portion and/or an end on a side of the support portion in the first connection portion increases in width as it approaches the support portion.

17. An actuator device according to claim 13,
wherein the actuator device is configured such that the movable portion swings at resonance frequency thereof.

* * * * *